(12) United States Patent
Lin et al.

(10) Patent No.: US 11,646,234 B2
(45) Date of Patent: May 9, 2023

(54) METHOD FOR FINFET FABRICATION AND STRUCTURE THEREOF

(71) Applicant: Taiwan Semiconductor Manufacturing Co., Ltd., Hsin-Chu (TW)

(72) Inventors: Han-Yu Lin, Hsinchu (TW); Yi-Ruei Jhan, Hsinchu (TW); Fang-Wei Lee, Hsinchu (TW); Tze-Chung Lin, Hsinchu (TW); Chao-Hsien Huang, Hsinchu (TW); Li-Te Lin, Hsinchu (TW); Pinyen Lin, Rochester, NY (US); Akira Mineji, Hsinchu (TW)

(73) Assignee: TAIWAN SEMICONDUCTOR MANUFACTURING CO., LTD, Hsinchu (TW)

(*) Notice: Subject to any disclaimer, the term of this patent is extended or adjusted under 35 U.S.C. 154(b) by 18 days.

(21) Appl. No.: 17/362,025

(22) Filed: Jun. 29, 2021

(65) Prior Publication Data

US 2021/0327764 A1 Oct. 21, 2021

Related U.S. Application Data

(62) Division of application No. 16/298,720, filed on Mar. 11, 2019, now Pat. No. 11,056,393.

(Continued)

(51) Int. Cl.
*H01L 21/8234* (2006.01)
*H01L 27/088* (2006.01)
*H01L 21/265* (2006.01)
*H01L 21/764* (2006.01)
*H01L 21/3105* (2006.01)

(Continued)

(52) U.S. Cl.
CPC .. *H01L 21/823431* (2013.01); *H01L 21/0228* (2013.01); *H01L 21/02164* (2013.01); *H01L 21/26586* (2013.01); *H01L 21/31053* (2013.01); *H01L 21/31116* (2013.01); *H01L 21/764* (2013.01); *H01L 21/823481* (2013.01); *H01L 27/0886* (2013.01)

(58) Field of Classification Search
CPC .......... H01L 21/823431; H01L 21/764; H01L 21/823481; H01L 21/31053; H01L 27/0886; H01L 21/26586; H01L 21/02164; H01L 21/0228; H01L 21/31116; H01L 21/31155
See application file for complete search history.

(56) References Cited

U.S. PATENT DOCUMENTS 8,796,666 B1 8/2014 Huang et al.
8,822,243 B2 9/2014 Yan et al.
(Continued)

*Primary Examiner* — Thanh Y. Tran
(74) *Attorney, Agent, or Firm* — Haynes and Boone, LLP

(57) ABSTRACT

A semiconductor device includes a semiconductor substrate, a semiconductor fin protruding from the semiconductor substrate, and an isolation layer disposed above the semiconductor substrate. The isolation layer includes a first portion disposed on a first sidewall of the semiconductor fin and a second portion disposed on a second sidewall of the semiconductor fin. Top surfaces of the first and second portions of the isolation layer are leveled. The first portion of the isolation layer includes an air pocket. The semiconductor device also includes a dielectric fin with a bottom portion embedded in the second portion of the isolation layer.

20 Claims, 9 Drawing Sheets

Related U.S. Application Data

(60) Provisional application No. 62/737,798, filed on Sep. 27, 2018.

(51) Int. Cl.
*H01L 21/02* (2006.01)
*H01L 21/311* (2006.01)

(56) References Cited

U.S. PATENT DOCUMENTS

| | | |
|---|---|---|
| 8,987,142 B2 | 3/2015 | Lee et al. |
| 9,093,530 B2 | 4/2015 | Huang et al. |
| 9,053,279 B2 | 6/2015 | Chang et al. |
| 9,099,530 B2 | 8/2015 | Lin et al. |
| 9,153,478 B2 | 10/2015 | Liu et al. |
| 9,501,601 B2 | 11/2016 | Chang et al. |
| 9,548,303 B2 | 1/2017 | Lee et al. |
| 9,876,114 B2 | 1/2018 | Huang |
| 2011/0073940 A1 | 3/2011 | Lee et al. |
| 2015/0137308 A1 | 5/2015 | Akarvardar et al. |
| 2018/0096999 A1 | 4/2018 | Zhou |
| 2019/0273011 A1 | 9/2019 | Sung et al. |
| 2020/0075342 A1* | 3/2020 | Chen ................. H01L 21/31144 |

* cited by examiner

METHOD FOR FINFET FABRICATION AND STRUCTURE THEREOF

PRIORITY DATA

This is a divisional application of U.S. patent application Ser. No. 16/298,720, filed Mar. 11, 2019, which claims the benefit of U.S. Provisional Patent Application Ser. No. 62/737,798 filed Sep. 27, 2018, the entire disclosures of which are herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In the formation of FinFET devices, trenches are formed between fin elements of the FinFET devices, which are then filled with a dielectric material. As the widths of the trenches get smaller, seams (e.g., air pockets) are formed in the dielectric material filling the trenches. Such seams may cause various issues during subsequent processes, resulting in flaws in subsequent formed features. For example, a seam may appear asymmetrically on one side of a fin but not on the other side, which causes uneven etching of the dielectric material surrounding the fin in a dielectric material recess process. This affects the performance uniformity of the FinFET devices. Thus, the existing techniques have not proved entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
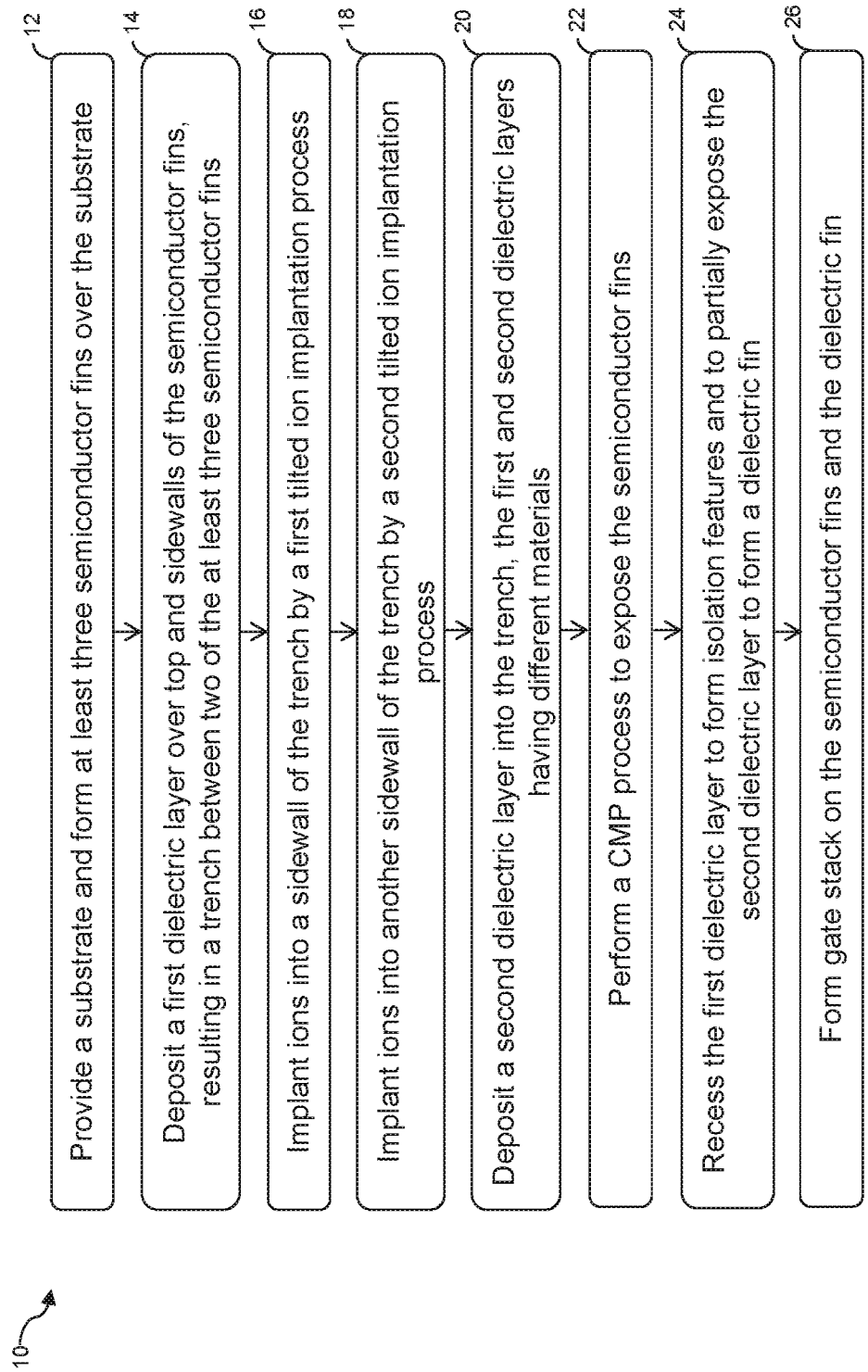
FIG. 1 shows a block diagram of a method of forming a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure in various embodiments is generally related to semiconductor devices and methods of forming the same. In particular, the present disclosure is related to recessing dielectric materials evenly in field effect transistors (FETs) including FETs having fin-like channels (FinFETs). In some embodiments, in an isolation structure surrounding a fin, seams (e.g., air pockets) appear asymmetrically on one side of the fin, which may cause uneven etching of the isolation structure during a recess process. The present disclosure provides treatment to top portions of the isolation structure. The treatment, such as a tilted ion implantation, compensates etch rate of the dielectric material of the isolation structure on one side of the fin, resulting in the isolation structure to have consistent average etch rates on both sides of the fin. The present disclosure helps increasing performance uniformity of fins.

FIG. 1 shows a flow chart of a method 10 for forming a semiconductor device, such as a FinFET device, according to various aspects of the present disclosure. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2-9. FIGS. 2-9 show exemplary cross-sectional views of a semiconductor device 100 at various stages of the method 10.

The semiconductor device 100 may be an intermediate device fabricated during processing of an integrated circuit (IC), or a portion thereof, that may comprise static random access memory (SRAM) and/or logic circuits, passive components such as resistors, capacitors, and inductors, and active components such as FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof. Furthermore, the various features including transistors, gate stacks, active regions, isolation structures, and other features in various embodiments of the present disclosure are provided for simplification and ease of understanding and do not necessarily limit the embodiments to any types of devices, any number of devices, any number of regions, or any configuration of structures or regions.

Figure 2:
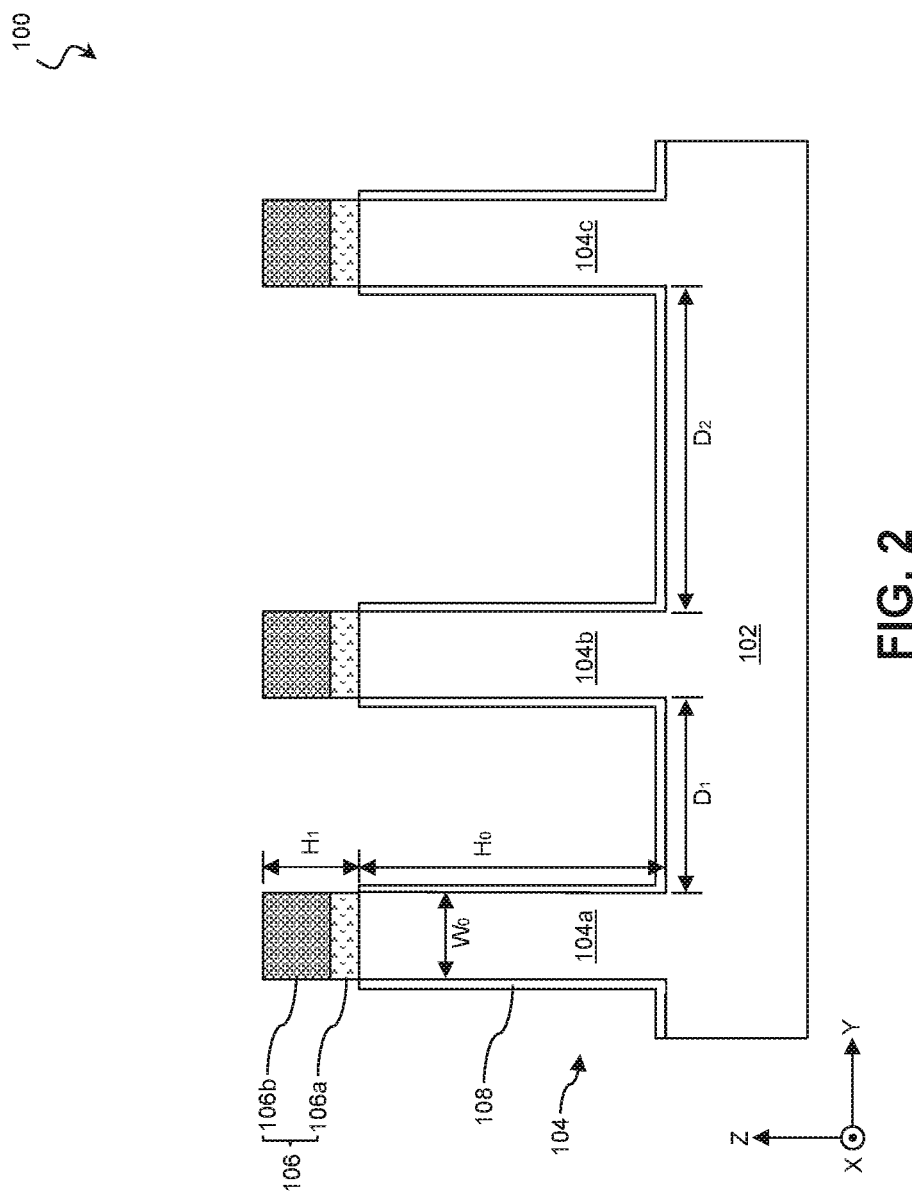
FIGS. 2, 3, 4, 5, 6, 7, 8, and 9 illustrate cross-sectional views of forming a target semiconductor device in intermediate steps of fabrication according to the method of FIG. 1, in accordance with some embodiments.

Referring to FIG. 1, at operation 12, the method 10 provides (or is provided with) a structure (or device 100) as shown in FIG. 2. The device 100 includes a substrate 102 and various structures (or features) built therein or thereon. Particularly, the device 100 includes semiconductor fins 104 (e.g., 104a-c) protruding out of the substrate 102, a hard mask 106 that is used to pattern the semiconductor fins 104, and a liner 108 that covers sidewalls of the semiconductor fins 104 and surfaces of the substrate 102.

The substrate 102 is a silicon substrate in the illustrated embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 102 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include semiconductor-on-insulator (SOI) substrates 102 having a buried dielectric layer. In some such examples, a layer of the substrate 102 may include an insulator such as a silicon oxide, a silicon nitride, a silicon oxynitride, a silicon carbide, and/or other suitable insulator materials.

The semiconductor fins 104 may include one or more semiconductor materials such as silicon, germanium, or silicon germanium. In an embodiment, each of the semiconductor fins 104 may include multiple different semiconductor layers stacked one over the other. The semiconductor fins 104 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 104 by etching initial epitaxial semiconductor layers of the substrate 102. The etching process can include dry etching, wet etching, reactive ion etching (RIE), and/or other suitable processes.

In an embodiment, the operation 12 may epitaxially grow semiconductor materials over the entire surface of the substrate 102, and then etch the semiconductor materials using the hard mask 106 as an etch mask to produce the semiconductor fins 104. The hard mask 106 may include any suitable dielectric material such as silicon nitride. The hard mask 106 may further include multiple layers, such as a bi-layer stack, which includes a lower layer 106a and an upper layer 106b. Suitable materials for these layers may be selected, in part, based on etchant selectivity. In an embodiment, the lower layer 106a is a pad oxide layer and the upper layer 106b is an overlying pad nitride layer. The pad oxide layer may be a thin film comprising silicon oxide formed, for example, using a thermal oxidation process. The pad oxide layer 106a may act as an adhesion layer between the substrate 102 and the pad nitride layer 106b and may act as an etch stop layer for etching the pad nitride layer 106b. In an embodiment, the pad nitride layer 106b is formed of silicon nitride, for example, using low-pressure chemical vapor deposition (LPCVD) or plasma enhanced chemical vapor deposition (PECVD). In some embodiments, the hard mask 106 has a height $H_1$ that ranges from about 20 nanometers (nm) to about 40 nm, such as about 22 nm.

The hard mask 106 may be patterned using suitable processes including double-patterning processes, multi-patterning processes, photolithography, self-aligned processes, and mandrel-spacer processes. The hard mask 106 is subsequently used to pattern exposed portions of the substrate 102, thereby forming semiconductor fins 104 as illustrated in FIG. 2. As will be explained in further detail below, the space between adjacent semiconductor fins 104 will be subsequently filled with a dielectric material, forming isolation structures such as shallow trench isolation (STI) features.

The semiconductor fins 104 are arranged lengthwise along the x direction and may be spaced evenly or unevenly along the fin width direction (the y direction). As shown in FIG. 2, in the illustrated embodiment, the device 100 includes three semiconductor fins 104, namely 104a, 104b, and 104c from left to right along the y direction. While FIG. 2 illustrates three semiconductor fins, the device 100 may include any number of semiconductor fins. The semiconductor fins 104a, 104b, and 104c are lengthwise substantially parallel to each other. The term "substantially parallel" refers to two lines being paralleled or forming an angle less than 10 degrees. In some embodiments, each of the semiconductor fins 104a, 104b, and 104c has a fin height $H_0$. The fin height $H_0$ is measured from a top surface of a semiconductor fin to a top surface of the substrate. In an embodiment, the fin height $H_0$ ranges from about 100 nm to about 150 nm, such as about 120 nm. In some embodiments, each of the semiconductor fins 104a, 104b, and 104c has a width $W_0$. In an embodiment, the width $W_0$ ranges from about 5 nm to about 15 nm, such as about 12 nm. The semiconductor fins 104a, 104b, and 104c may have fin widths substantially the same or different from each other.

Each of semiconductor fins 104 has two sidewalls. For adjacent semiconductor fins, sidewalls of the adjacent semiconductor fins are facing each other. The semiconductor fins 104a and 104b are separated from each other by a spacing $D_1$. The semiconductor fins 104b and 104c are separated from each other by a spacing $D_2$. In an embodiment, each of the spacing $D_1$ and $D_2$ is between about 10 nm and about 60 nm. In some examples, the spacing between the semiconductor fins 104b and 104c is larger than that between the semiconductor fins 104a and 104b (e.g., by more than about 20%). In the illustrated embodiment, the spacing between the semiconductor fins 104b and 104c is equal to or larger than twice of that between the fins 104a and 104b (i.e., $D_2 \geq 2D_1$). Due to the larger spacing between the semiconductor fins 104b and 104c, the device 100 has a non-uniform fin density across the illustrated area, with a relatively lower fin density around the semiconductor fins 104b and 104c. As will be explained in further detail below, one or more dielectric fins will be formed in regions with relatively low fin densities, such as the region between the semiconductor fins 104b and 104c. The dielectric fins will increase fin density in such regions. One of the benefits of a higher fin density is that it provides better support for the semiconductor fins against fin collapsing when aspect ratio of semiconductor fins increases as semiconductor devices are scaled down progressively. Other benefits of a higher fin density includes providing better support for features to be formed above the semiconductor fins, such as source/drain contacts metals, which might otherwise suffer from metal pulling into regions between widely separated semiconductor fins.

Sidewalls of the semiconductor fins 104 and surfaces of the substrate 102 are conformally covered by the liner 108 in the illustrated embodiment. In some embodiments, the liner 108 conformally covers the top and sidewalls of the hard mask 106. The liner 108 helps reduce or prevent dopants in the semiconductor fins (e.g., boron) from migrating into surrounding regions. The liner 108 may also help retard germanium diffusion in a fin reform process that replaces portions of a silicon fin with other semiconductor materials having different lattice constants, such as silicon germanium. In an embodiment, the liners 108 are formed using, for example, an oxidation process and a nitridation process. In some embodiments, the oxidation process comprises a thermal oxidation process, rapid thermal oxidation (RTO) process, chemical oxidation process, in-situ stream generation (ISSG) process, or enhanced in-situ stream generation (EISSG) process. In some embodiments, the nitridation process comprises thermal nitridation with a furnace or rapid thermal anneal (RTA) using $NH_3$, $N_2O$, $N_2$, or the like ambient.

As a result of the oxidation and nitridation processes described above, the liner 108 may include one or more sub layers. The oxidation process results in an oxide layer having a determined thickness. The nitridation process results in the nitrogen atoms reacting with the oxide layer to form an oxynitride layer, such as a silicon oxynitride layer in an embodiment in which the substrate 102 is a silicon substrate. If a selected nitridation process is performed for a sufficient period of time, an entire thickness of the oxide layer may become an oxynitride layer. If a selected nitridation process is performed for a shorter period of time, a portion of the oxide layer may remain, resulting in an oxide layer and an overlying nitride layer. The process conditions may be adapted to provide a desired thickness of the oxide layer and the nitride layer. In an embodiment, the liner 108 is a silicon oxynitride layer with a thickness ranging from about 1 nm to about 5 nm.

Figure 3:
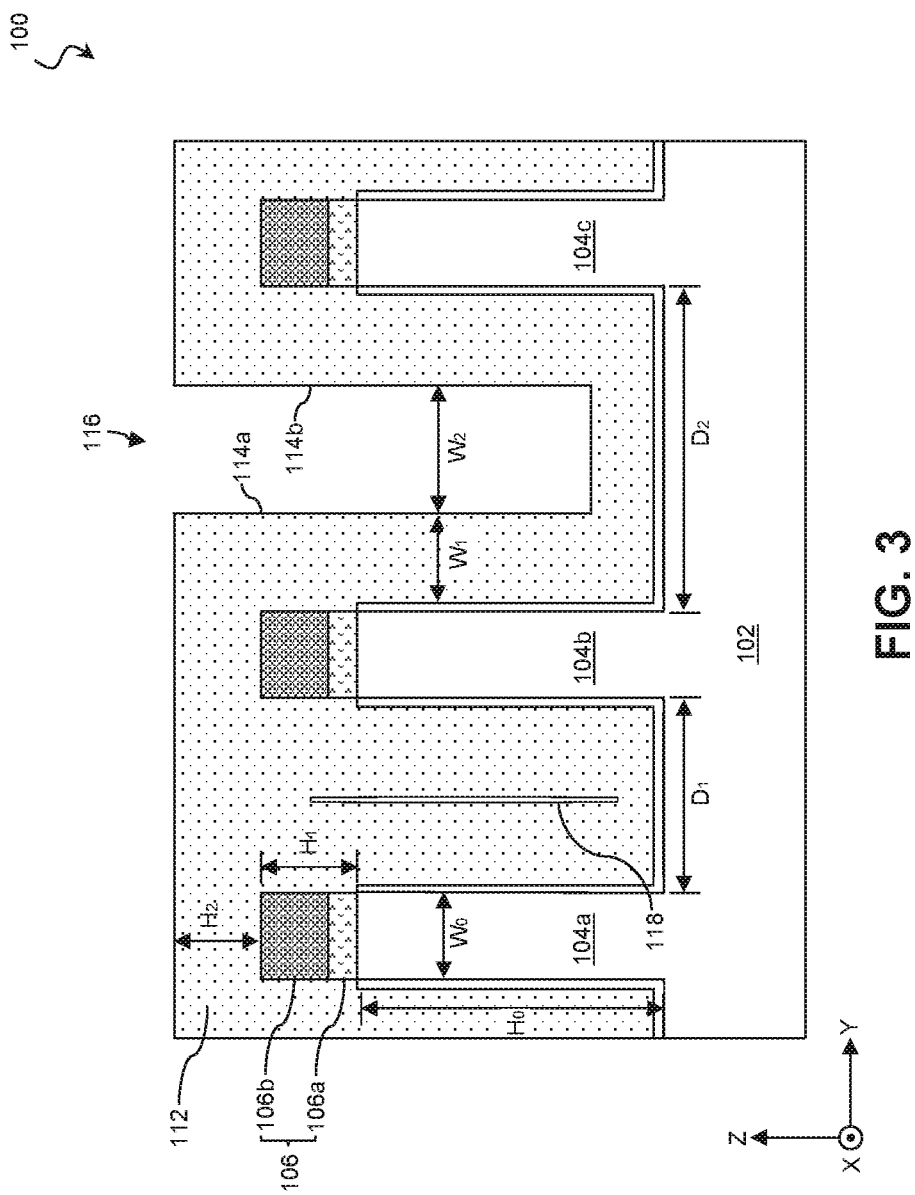

At operation 14, the method 10 (FIG. 1) deposits a dielectric material on surfaces of the device 100 to form an isolation structure 112, as shown in FIG. 3. In some embodiments, the isolation structure 112 is a shallow trench isolation (STI) feature. The isolation structure 112 is deposited over the top surface of the substrate 102 and over the exposed surfaces of the semiconductor fins 104 and hard mask 106. Suitable dielectric materials for the isolation structure 106 include silicon oxides, silicon nitrides, silicon carbides, FluoroSilicate Glass (FSG), low-K dielectric materials, combinations thereof, and/or other suitable dielectric materials. In the illustrated embodiment, the isolation structure 106 includes silicon oxide. In some embodiments, the isolation structure 106 may include a multi-layer structure, for example, having one or more liner layers. In various examples, the dielectric material may be deposited by any suitable technique including thermal growth, chemical vapor deposition (CVD), subatmospheric CVD (SACVD) process, a flowable CVD process, an atomic layer deposition (ALD) process, a physical vapor deposition (PVD) process, a spin-on process, and/or other suitable process.

In the illustrated embodiment, a conformal deposition technique is used, such as an ALD process. During the ALD process, the isolation structure 112 is deposited as a conformal layer, covering each of the semiconductor fins 104 and filling into the spaces between adjacent semiconductor fins 104. During the ALD process, width $W_1$ of isolation structure 112 along the y direction and thickness $H_2$ along the z direction (above the hard mask 106) gradually grow and the spacing between adjacent semiconductor fins reduces correspondingly. Since the space between the semiconductor fins 104a and 104b is narrower than the space between the semiconductor fins 104b and 104c, the space between the semiconductor fins 104a and 104b will be first filled up by the dielectric material. As a comparison, the space between the semiconductor fins 104b and 104c is not filled up but left with a dielectric trench 116 with a width $W_2$ defined between two opposing dielectric sidewalls 114a and 114b. Extra layers of the isolation structure 112 may be further filled in the dielectric trench 116 so as to control the width $W_2$. The width $W_2$ may be the same or different with the isolation structure 112's width $W_1$. Further, the width $W_2$ may be smaller than, equal to, or greater than the width $W_0$ of the semiconductor fins 104 in various embodiments. In some embodiments, the isolation structure 112 has the width $W_1$ (as well as the thickness $H_2$) ranging from about 5 nm to about 20 nm, such as about 12 nm, and the trench 116 has the width $W_2$ ranging from about 9 nm to about 30 nm, such as about 14 nm.

The trench 116 will be filled with a dielectric fin in a later fabrication step. As discussed above, one design consideration is that, once filled in, the dielectric fin will help improving the uniformity of the fins. This design consideration in conjunction with the width and pitch of the semiconductor fins 104 may be used for controlling the thickness of the isolation structure 112 during the deposition process.

During the dielectric material filling into the space between the semiconductor fins 104a and 104b, as the width of the space gets smaller, a seam (e.g., an air pocket) 118 may be sealed in the dielectric material. The seam 118 generally locates in the middle of the semiconductor fins 104a and 104b and extends lengthwise along the z direction. The formation of the seam 118 is mainly due to the high aspect ratio of the relatively narrow space between the semiconductor fins 104a and 104b and a slightly higher deposition rate at top portions of the isolation structure 112 during the ALD process, which causes the dielectric material to cap the seam 118 before filling it up. The seam 118 itself has a high aspect ratio, such as larger than 10:1 in various embodiments. Therefore, the seam 118 is also referred to as the seam 118. In some embodiments, the seam 118 has a width ranging from about 0.1 nm to about 2 nm, such as about 0.5 nm. In some embodiments, a topmost portion of the seam 118 is above the pad oxide layer 106a, but is lower than a topmost portion of the pad nitride layer 106b.

The seam 118 is generally undesirable as it may create problems both during semiconductor device fabrication and in the finished devices. In some examples, the seam 118 is formed with unpredictable sizes and aspect ratios. Further, the existence of the seam 118 is asymmetric to some of the semiconductor fins 104, such as the semiconductor fin 104b. The seam 118 is formed on one side of the semiconductor fin 104b, but not on the other, which results in unpredictable and inconsistent post-deposition processing of the isolation structure 112, such as uneven etching, polishing, and/or annealing. As an example, in a later fabrication step of recessing the isolation structure 112 to expose top portions of the semiconductor fins 104, the dielectric material on the left side of the semiconductor fin 104b may have a higher etch rate than that on the right side. The etch rate difference is mainly due to a lower average dielectric material density on the left side and also preferential etching once an etchant leaks into the seam 118. Such etch rate difference on two sides of the semiconductor fin 104b will cause the dielectric material on its left side to recess more than that on its right side, thereby resulting in the semiconductor fin 104b to have uneven exposed fin lengths on its two sides. The exposed fin lengths non-uniformity is inferior to the device performance and yield rate. Treatments in subsequent operations are implemented to mitigate the etch rate variation due to the asymmetric existence of the seam 118.

Figure 4:
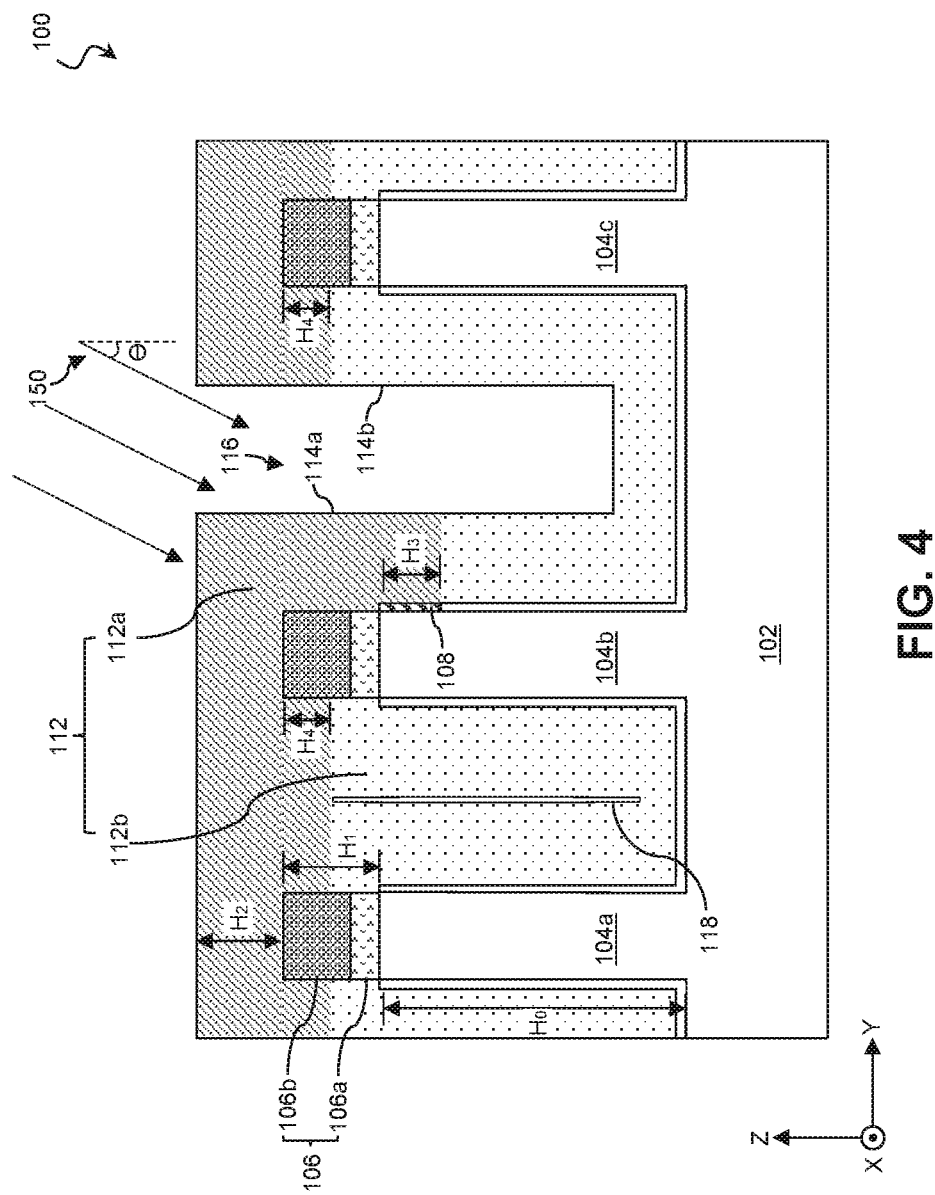
Figure 5:
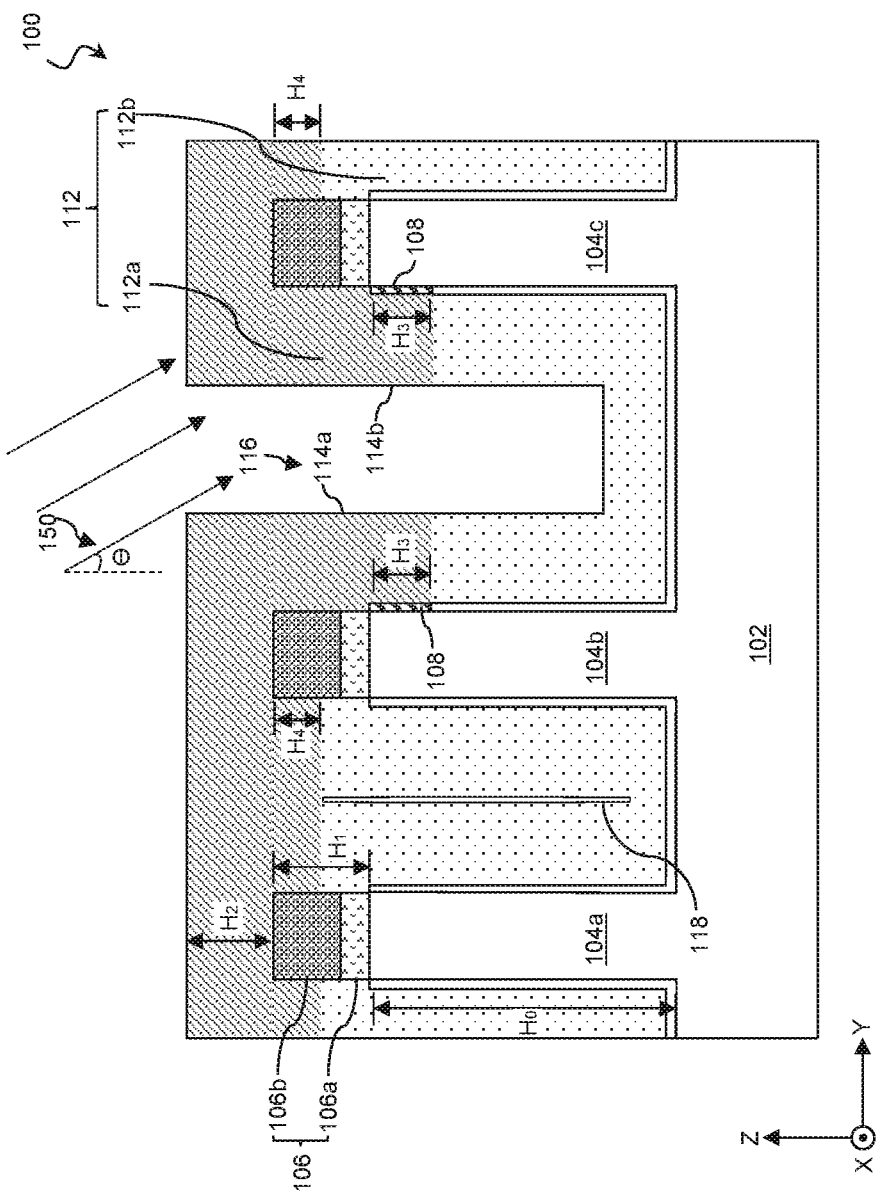

At operation 16, the method 10 (FIG. 1) applies a first directional treatment to the dielectric sidewall 114a of the dielectric trench 116, such as along a first direction tilted away from the normal to the top surface of the substrate 102 (FIG. 4). At operation 18, the method 10 (FIG. 1) applies a second directional treatment to the dielectric sidewall 114b of the dielectric trench 116, such as along a second direction tilted away from the normal to the top surface of the substrate 102 (FIG. 5). In one embodiment, operations 16 and 18 may be applied simultaneously in one treatment process that provides both first and second directional treatments at the same time.

In various embodiments, each of the first and second directional treatments includes an ion implantation process 150 which reduces the etch resistance of a top portion of the isolation structure 112. The ions penetrate into the isolation structure 112 up to certain depths. The top portion of the isolation structure 112 receiving ions is denoted as implanted portion 112a. The bottom portion of the isolation structure 112 substantially free of ions is denoted as untreated portion 112b. The use of tilted ion implantation process 150 ensures that ions are implanted into various desired depths on different regions of the isolation structure 112, such that implanted portion 112a adjacent to the dielectric trench 116 has a larger depth than implanted portion 112a above the seam 118 due to shadow effect. In many embodiments, the extent of the implantation (i.e., bombardments of ions) is controlled by varying an angle θ of the titled dosage source to be from about 15 degrees to about 25 degrees with respect to the Z direction, such as about 20 degrees. A specific angle θ may be chosen based on a desired implantation depth on the dielectric sidewalls 114a and 114b, as well as a desired depth difference on both sides of the semiconductor fin 104b. In some examples, if the angle θ is larger than about 25 degrees, the depth of implantation may be too shallow to accommodate subsequent fabrication processes. In some examples, if the angle θ is smaller than about 15 degrees, implantation depths on both sides of the semiconductor fin 104b may become too deep, and the depth difference caused by shadow effect diminishes. Also, when the angle θ is smaller than about 15 degrees, ions may penetrate into the semiconductor fins 104 from the top, which introduces impurities into the fins. In the illustrated embodiment, for the implanted portion 112a adjacent to the dielectric trench 116, ions are implanted to a depth $H_3$ lower than a top surface of the semiconductor fin 104b; for the implanted portion 112a above the seam 118, ions are implanted to a depth $H_4$ lower than a top surface of the hard mask 106 but not below a top surface of the semiconductor fin 104b. A top portion of the liner 108 facing the dielectric trench 116 may also be implanted with ions. The liner 108 overall reduces or prevents ions from entering into the semiconductor fins 104. In some examples, the depth $H_3$ is about 5% to about 15% of the fin height $H_0$. In one example, the depth $H_3$ ranges from about 5 nm to about 15 nm. In some examples, the depth $H_4$ is about half of the hard mask thickness $H_1$. In one example, the depth $H_4$ is less than about 15 nm. In the illustrated embodiment, a bottom surface of the implanted portion 112a between the semiconductor fins 104a and 104b is above a topmost portion of the seam 118. In an alternative embodiment, a bottom surface of the implanted portion 112a between the semiconductor fins 104a and 104b is below a topmost portion of the seam 118.

In various embodiments, the ions implanted into the isolation structure 112 by the first and second tilted ion implantation processes include argon, helium, hydrogen, or a combination thereof. The implanted ions impart molecular disorder to the dielectric material of the implanted portion 112a. The bombardment of ions creates dangling bonds within the molecular structure. Also, the bombardment of ions creates porous in the molecular structure, which reduces average material density of the implanted portion 112a. For at least these reasons, the implanted portion 112a has a smaller etch resistance compared to the untreated portion 112b. Molecules larger than argon, helium, or hydrogen in terms of mass and size, such as $BF_2$, phosphorous, or a combination thereof, may also be used for the implantation process. The larger molecules are more effective on creating dangling bonds and porous in the dielectric material. In some embodiments, each tilted ion implantation process applies ion dose density of about $1.5 \times 10^{16}$ cm$^{-2}$ to about $3.5 \times 10^{16}$ cm$^{-2}$. The ion dose density affects implanted ions' impact on molecular disorder of the dielectric material. In some examples, if the ion dose density is below about $1.5 \times 10^{16}$ cm$^{-2}$, there might not be appreciable effects on the etch rate difference between the implanted portion 112a and the untreated portion 112b. On the other hand, if the ion dose density is larger than about $3.5 \times 10^{16}$ cm$^{-2}$, the cost of the dose may be too high. In some embodiments, each tilted ion implantation process applies ion implantation energy of about 1 keV to about 3 keV. The ion implantation energy affects the depth of implantation both vertically and horizontally. In some examples, if the ion implantation energy is below about 1 keV, the implantation depth may be too shallow to accommodate subsequent fabrication processes. On the other hand, if the ion implantation energy is above about 3 keV, the ions may penetrate into and damage semiconductor fins 104 and adversely affect functions of the fins.

After operations 16 and 18, the implanted portion 112a between the semiconductor fins 104b and 104c is thicker than between the semiconductor fins 104a and 104b. Accordingly, untreated portion 112b between the semiconductor fins 104b and 104c is thinner than between the semiconductor fins 104a and 104b. Since the implanted portion 112a has a fast etch rate than the untreated portion 112b due to the molecular disorder, as will be discussed, the thicker implanted portion 112a will compensate the overall etch rate of the isolation structure 112 between the semiconductor fins 104b and 104c during a subsequent recess process.

Figure 6:
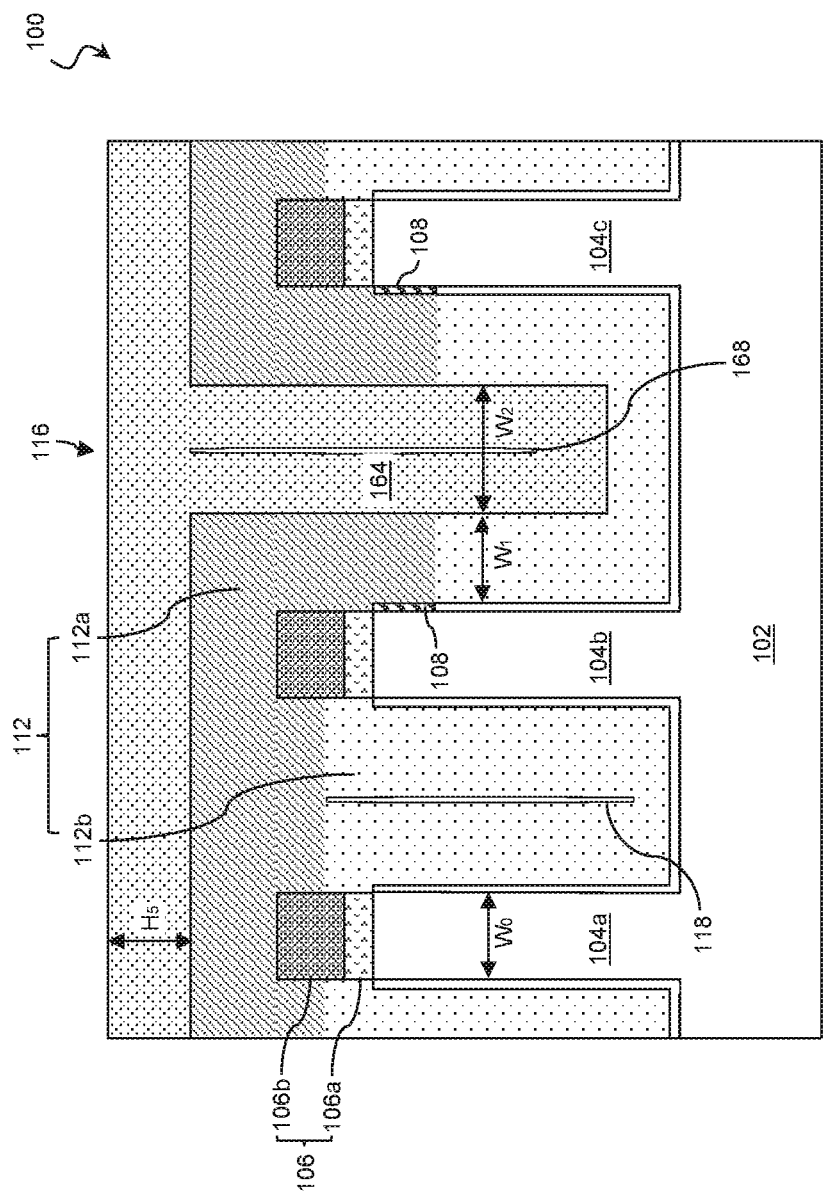

At operation 20, the method 10 (FIG. 1) deposits one or more dielectric materials over the device 100 and the isolation structure 112, thereby filling the dielectric trench 116 as shown in FIG. 6. The one or more dielectric materials may include silicon carbide nitride (SiCN), silicon oxycarbide nitride (SiOCN), silicon oxycarbide (SiOC), a metal oxide such as hafnium oxide ($HfO_2$) or zirconium oxide ($ZrO_2$), or a combination thereof; and may be deposited using ALD, CVD, PVD, or other suitable methods. The one or more dielectric materials in the trench 116 become the dielectric fin 164. The dielectric fin 164 has a width $W_2$ that may be smaller than, equal to, or greater than the width $W_0$ of the semiconductor fins 104 in various embodiments. In one example, the dielectric fin 164 has the width $W_2$ ranging from about 9 nm to about 30 nm, such as about 14 nm. Once filled in, the dielectric fin 164 helps improve the uniformity of the fins. As illustrated in FIG. 6, the fins 104 and 164 are more uniformly distributed along the y direction than the semiconductor fins 104 alone. In various embodiments, the dielectric fin 164 and the isolation structure 112 have different material compositions. In one example, the isolation structure 112 includes silicon oxide and the dielectric fin 164 includes silicon, oxide, carbon, and nitride.

In an example, the dielectric fin 164 includes aluminum oxide ($Al_2O_3$) deposited by an ALD process. During the ALD process, the dielectric material of the dielectric fin 164 is deposited as a conformal layer, covering the isolation structure 112 and filling into the dielectric trench 116. The dielectric material may be deposited to a height $H_5$ above a top surface of the isolation structure 112, ranging from about 5 nm to about 20 nm, such as about 12 nm. During the ALD process, the width of the dielectric trench 116 reduces correspondingly. As the width of the dielectric trench 116 gets smaller, a seam (e.g., an air pocket) 168 may be sealed in the dielectric material of the dielectric fin 164. The seam 168 generally locates in the middle of the dielectric fin 164 and extends lengthwise along the z direction. The formation of the seam 168 is mainly due to the high aspect ratio of the narrow space in the dielectric trench 116 and a slightly higher deposition rate at top portions of the dielectric material during the ALD process, which causes the dielectric material to cap the seam 168 before filling it up. The seam 168 itself has a high aspect ratio, such as larger than 10:1 in various embodiments. Therefore, the seam 168 is also referred to as the seam 168. In some embodiments, the seam 168 has a width ranging from about 0.1 nm to about 2 nm, such as about 0.5 nm. In some embodiments, a topmost portion of the seam 168 is above a top surface of the isolation structure 112.

Figure 7:
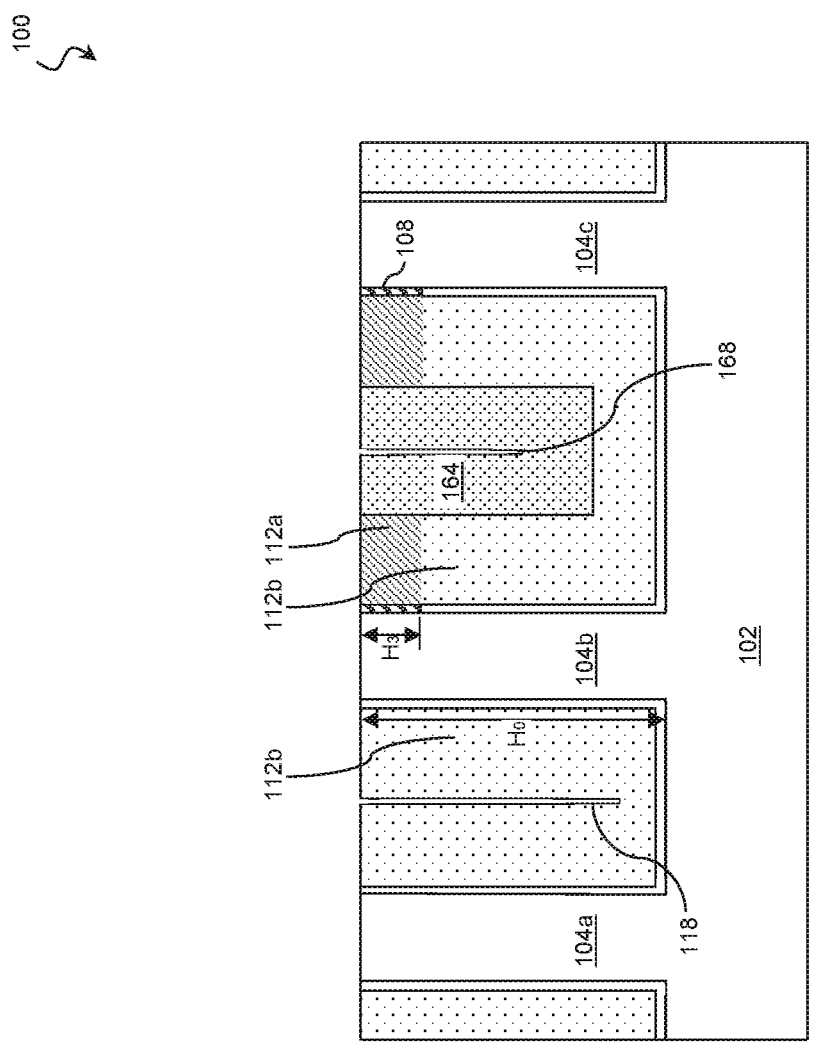

At operation 22, the method 10 (FIG. 1) performs one or more chemical mechanical planarization (CMP) processes to remove excess dielectric material, as shown in FIG. 7. In some embodiments, the hard mask 106 may function as a CMP stop layer. In the illustrated embodiment, the hard mask 106 is also removed in the CMP process. The seams 118 and 168 may be uncapped after the CMP process. Between semiconductor fins 104a and 104b, since ion implantation in operations 16 and 18 does not reach a depth below a top surface of the semiconductor fins 104, only the untreated portion 112b of the isolation structure 112 remains after the CMP process. As a comparison, between semiconductor fins 104b and 104c, the implanted portion 112a still remains above the untreated portion 112b. In some examples, the remained implanted portion 112a has a depth $H_3$, which is about 5% to about 15% of the fin height $H_0$.

Figure 8:
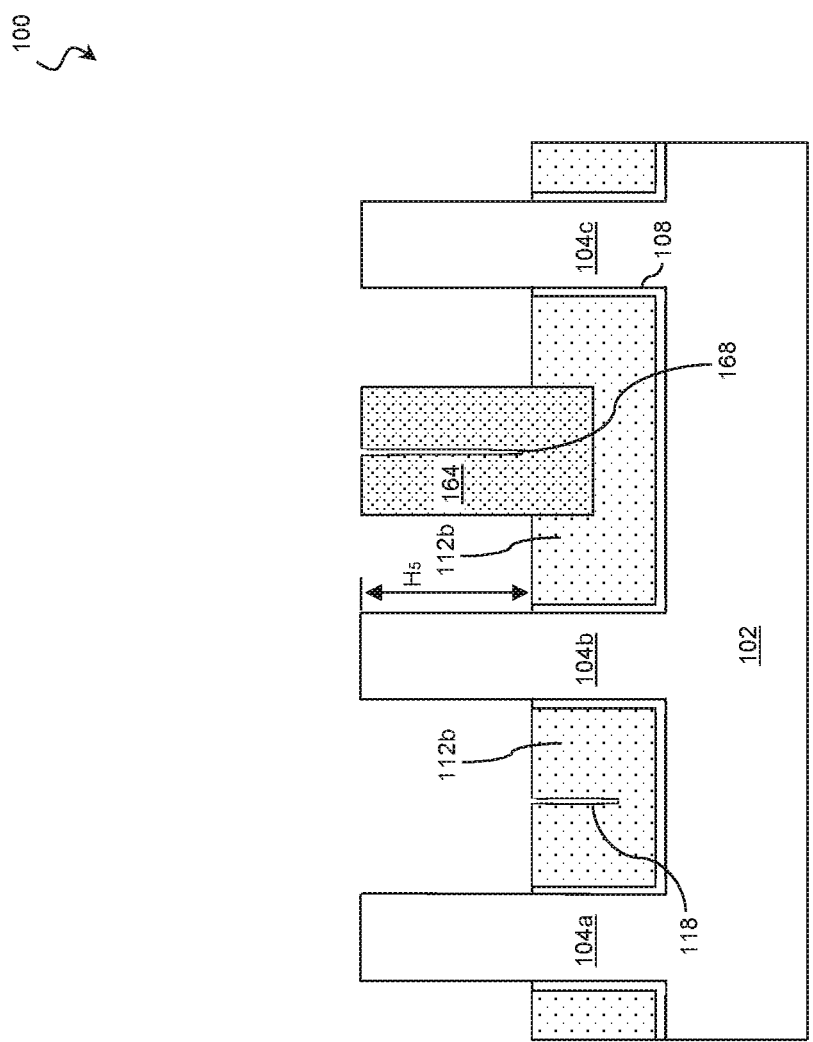

At operation 24, the method 10 (FIG. 1) recesses the isolation structure 112, as shown in FIG. 8. The isolation structure 112 is recessed, for example, by a dry etching process or a wet etching process that is selective to the dielectric material of the isolation structure 112 and does not etch either the semiconductor fins 104 or the dielectric fin 164. The liner 108 on sidewalls of the semiconductor fins 104 may also be recessed during or after the recessing of the isolation features 106. In an embodiment, the operation 24 applies a plasma-less hydrogen fluoride (HF) dry etch process to recess the isolation structure 112. The dry etch process may be performed at a temperature in a range from about 30 degrees to about 90 degrees and a pressure in a range from about 0.2 Torr to about 2.5 Torr. The chemical etchant may include hydrogen fluoride (HF) and ammonia ($NH_3$) with a flow rate ratio of hydrogen fluoride to ammonia in a range from about 0.5 to about 5. In some embodiments, HF has a flow rate ranging from about 50 sccm to about 500 sccm, and $NH_3$ has a flow rate ranging from about 15 sccm to about 200 sccm. Ammonia functions as a catalyst to reduce the energy barrier of the dielectric material of the isolation structure 112 so that hydrogen fluoride can effectively react with the dielectric material even at a relatively low temperature and low pressure. During the dry etch process, ammonium fluorosilicate (($NH_4)_2SiF_6$) may be generated as an etching byproduct. Due to the high aspect ratios of the seams 118 and 164, ammonium fluorosilicate is easier to accumulate at the openings of these seams and cap them. The capping of the seams 118 and 164 by ammonium fluorosilicate helps blocking other impurities from entering these seams. Since ammonium fluorosilicate has a low melting point at about 100 degrees, the temperature during the dry etch process may be controlled under 100 degrees in some embodiments, such as under 90 degrees, to keep the seams 118 and 164 capped.

The dry etch process to recess the isolation structure 112 can be considered including two temporal phases. In the first phase, when the etch process starts, the part of the isolation structure 112 between the semiconductor fins 104b and 104c recesses faster than the part between the semiconductor fins 104a and 104b. This is because the etchant first reacts with the implanted portion 112a between the semiconductor fins 104b and 104c, which has a smaller etch resistance and thus an etch rate higher than the untreated portion 112b even with the seam 118, such as about 50% to about 100% higher in some embodiments. Therefore, a top surface of the recessed isolation structure 112 between the semiconductor fins 104b and 104c remains lower than that between the semiconductor fins 104a and 104b during the first phase. In the second phase, the implanted portion 112a has been completely removed. The etchant starts to react with the untreated portion 112b both between the semiconductor fins 104b and 104c and between the semiconductor fins 104a and 104b. Due to the existence of the seam 118, the untreated portion 112b between the semiconductor fins 104a and 104b has a relatively smaller material density. Also, etchant may leak into the seam 118 and has a larger etching surface. Consequently, the part of the isolation structure 112 between the semiconductor fins 104a and 104b recesses faster than the part between the semiconductor fins 104b and 104c. The elevation difference for the top surfaces of the recessed isolation structure 112 between the semiconductor fins 104a and 104b and between the semiconductor fins 104a and 104b starts to diminish. The dry etch process may be controlled by timer in some embodiments. At the end of the second phase, the top surfaces of the recessed isolation structure 112 are substantially coplanar across the regions from the semiconductor fins 104a to 104c. In other words, after the tilted ion implantations of operations 16 and 18, average etch rate during recessing the isolation structure 112 becomes substantially the same across the device 100 despite the existence of the seam 118 at certain locations in the isolation structure 112.

Still referring to FIG. 8, after operation 24, the semiconductor fins 104 and the dielectric fin 164 extend upwardly from the recessed isolation structure 112. Each semiconductor fin 104 has substantially the same fin lengths exposed on its two sides, which increases the uniformity of semiconductor fin performance. The semiconductor fins 104 and the dielectric fin 164 extend above the isolation structure 112 for approximately the same height, denoted as $H_5$. In some embodiments the height $H_5$ ranges from about 30 nm to about 80 nm, such as about 58 nm. The seam 118 has a reduced aspect ratio less than about 6:1, such as about 5:1. Similarly, the seam 168 has a reduced aspect ratio less than about 8:1, such as about 6:1. The seam 168 may have a larger length than the seam 118. The seam 118 has an opening at a top surface of the isolation structure 112 and extends downwardly in a direction generally perpendicular to a top surface of the substrate 102. Similarly, the seam 168 has an opening at a top surface of the dielectric fin 164 and extends downwardly in a direction generally perpendicular to the top surface of the substrate 102. The seams 118 and 168 are generally parallel lengthwise. Further, a bottommost portion of the seam 168 may be higher than a topmost portion of the seam 118, such that the bottommost portion of the seam 168 is above a top surface of the recess isolation structure 112. In an alternative embodiment, the bottommost portion of the seam 168 may be lower than a topmost portion of the seam 118, such that the bottom most portion of the seam 168 is below a top surface of the recess isolation structure 112. The method 100 may further include a baking process after operation 24 at a temperature higher ammonium fluorosilicate's decomposition point to uncap the seams 118 and 168.

Figure 9:
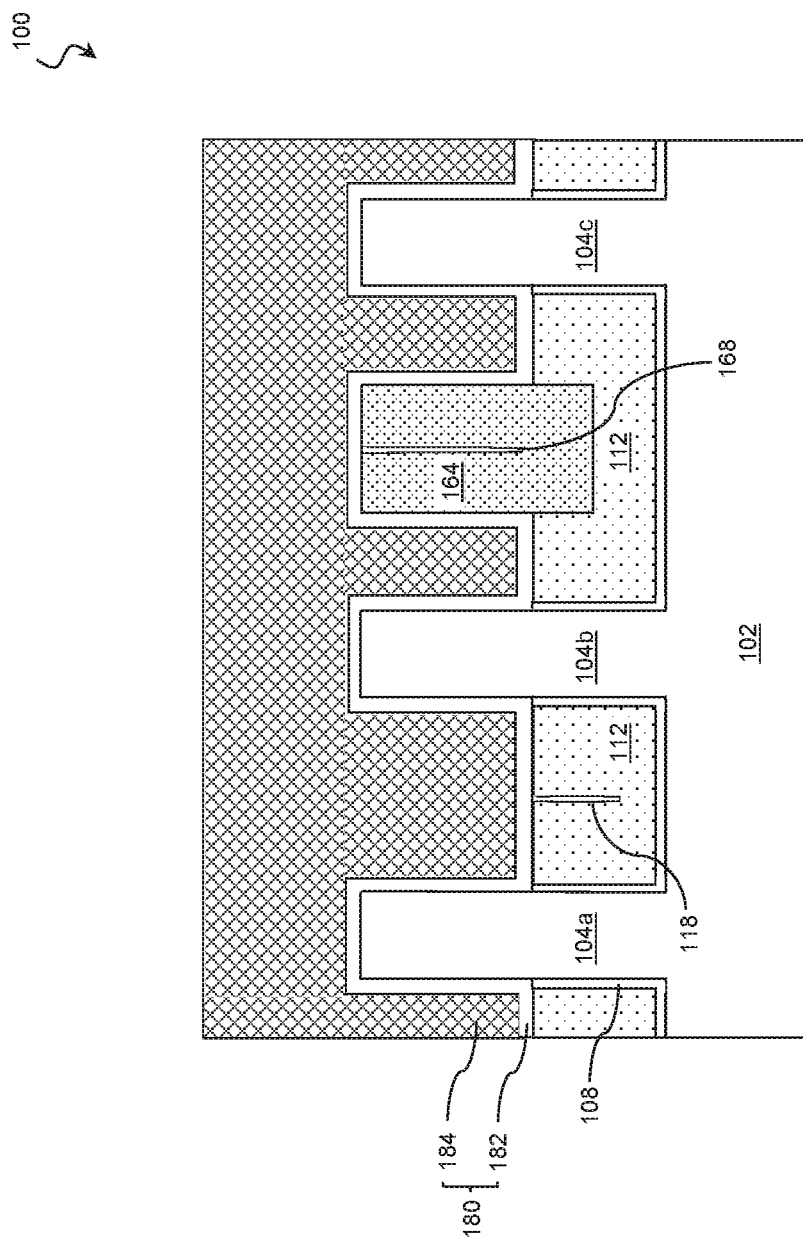

At operation 26, the method 100 (FIG. 1) proceeds to further operations to form a final device, as shown in FIG. 9. This includes a variety of processes. In one example, operation 26 forms a dummy gate stack (not shown), then replaces the dummy gate stack with a final gate stack 180. To further this example, the dummy gate stack is a placeholder having a dummy gate dielectric layer (e.g., silicon oxide) and a dummy gate electrode layer (e.g., polysilicon), while the final gate stack 180 is a high-k metal gate having a high-k gate dielectric layer 182 and a gate electrode 184 that may comprise a number of sub-layers, such as an appropriate n-type or p-type work function layer and a metal fill layer.

In some embodiments, the high-k gate dielectric layer 182 is deposited on the device 100 by any suitable technique, such as ALD, CVD, metal-organic CVD (MOCVD), PVD, thermal oxidation, combinations thereof, and/or other suitable techniques. A high-k-type gate dielectric layer 182 may include a metal oxide (e.g., LaO, AlO, ZrO, TiO, $Ta_2O_5$, $Y_2O_3$, $SrTiO_3$ (STO), $BaTiO_3$ (BTO), BaZrO, HfZrO, HfLaO, HfTaO, HfTiO, $(Ba,Sr)TiO_3$ (BST), $Al_2O_3$, etc.) a metal silicate (e.g., HfSiO, LaSiO, AlSiO, etc.), a metal or semiconductor nitride, a metal or semiconductor oxynitride, combinations thereof, and/or other suitable materials. In some embodiments, the high-k dielectric layer 182 caps the seams 118 and 168. Likewise, a gate electrode 184 is deposited on the channel regions of the device 100. In particular, the gate electrode 184 may be deposited on the high-k gate dielectric layer 182. In various examples, the gate electrode 184 may include a single layer or multiple layers, such as a metal layer, a liner layer, a wetting layer, and/or an adhesion layer. In the illustrated embodiment, the gate electrode 184 includes a work function layer and a metal fill layer. The work function layer may include a p-type work function layer or an n-type work function layer. The p-type work function layer comprises a metal selected from, but not limited to, the group of titanium nitride (TiN), tantalum nitride (TaN), ruthenium (Ru), molybdenum (Mo), tungsten (W), platinum (Pt), or combinations thereof. The n-type work function layer comprises a metal selected from, but not limited to, the group of titanium (Ti), aluminum (Al), tantalum carbide (TaC), tantalum carbonitride (TaCN), tantalum silicon nitride (TaSiN), or combinations thereof. The p-type or n-type work function layer may further include a plurality of layers and may be deposited by CVD, PVD, and/or other suitable process. The metal fill layer may include aluminum (Al), tungsten (W), or copper (Cu) and/or other suitable materials. The metal fill layer may be formed by CVD, PVD, plating, and/or other suitable processes.

Operation 26 may perform further steps to complete the fabrication of the device 100. For example, the method 10 may form contacts and vias electrically connecting source/drain features (not shown) and the gate stacks 180 and form metal interconnects connecting various transistors to form a complete IC.

Although not intended to be limiting, one or more embodiments of the present disclosure provide many benefits to a semiconductor device and the formation thereof. For example, during formation of dielectric fins to increase fin density, seams (e.g., air pockets) may asymmetrically appear on only one side of a semiconductor fin, which may cause uneven etching of the dielectric material on both sides of the semiconductor fin. In embodiments of the present disclosure, etch rates of the dielectric material on both sides of the semiconductor fin are tuned by treatments to achieve a consistent average etch rate around the semiconductor fin. The present disclosure helps increasing performance uniformity of fins. Various embodiments of the present disclosure may be easily integrated into existing manufacturing processes.

In one exemplary aspect, the present disclosure is directed to a method for FinFET fabrication. The method includes forming at least three semiconductor fins over a substrate, wherein first, second, and third of the semiconductor fins are lengthwise substantially parallel to each other, spacing between the first and second semiconductor fins is smaller than spacing between the second and third semiconductor fins; depositing a first dielectric layer over top and sidewalls of the semiconductor fins, resulting in a trench between the second and third semiconductor fins, bottom and two opposing sidewalls of the trench being the first dielectric layer; implanting ions into one of the two opposing sidewalls of the trench by a first tilted ion implantation process; implanting ions into another one of the two opposing sidewalls of the trench by a second tilted ion implantation process; depositing a second dielectric layer into the trench, the first and second dielectric layers having different materials; and etching the first dielectric layer. In some embodiments, the first and second dielectric layers are deposited using atomic layer deposition (ALD). In some embodiments, the method further includes performing a chemical mechanical planarization process to at least the first and second dielectric layers before the etching of the first dielectric layer. In some embodiments, each of the first and second tilted ion implantation processes has a tilt angle in a range from about 15 degrees to 25 degrees with reference to normal of the substrate. In some embodiments, each of the first and second tilted ion implantation processes applies ion implantation energy of about 1 keV to about 3 keV. In some embodiments, each of the first and second tilted ion implantation processes applies ion dose of about $1.5 \times 10^{16}$ $cm^{-2}$ to about $3.5 \times 10^{16}$ $cm^{-2}$. In some embodiments, the first dielectric layer includes silicon oxide and the ions implanted into the first dielectric layer by the first and second tilted ion implantation processes include Boron, phosphorous, or a combination thereof. In some embodiments, the first dielectric layer includes silicon oxide and the ions implanted into the first dielectric layer by the first and second tilted ion implantation processes include argon, helium, hydrogen, or a combination thereof. In some embodiments, the etching of the first dielectric layer includes plasma-less hydrogen fluoride dry etch. In some embodiments, the etching of the first dielectric layer further includes using ammonia as a catalyst for the plasma-less hydrogen fluoride dry etch. In some embodiments, a ratio of hydrogen fluoride to ammonia is in a range from about 0.5 to about 5. In some embodiments, the etching of the first dielectric layer is performed at a temperature ranging from about 30 degrees to about 90 degrees and a pressure ranging from about 0.2 Torr to about 2.5 Torr.

In another exemplary aspect, the present disclosure is directed to a method for FinFET fabrication. The method includes providing at least three fins protruding from a substrate; depositing a first dielectric layer over top and sidewalls of the three fins, resulting in a seam within the first dielectric layer between first and second of the three fins and a trench between the second and third of the three fins; implanting ions into a top portion of the first dielectric layer, wherein the ions are implanted into sidewalls of the trench more deeply than into the first dielectric layer above the seam; and etching the first dielectric layer to form an isolation feature. In some embodiments, the method further includes depositing a second dielectric layer into the trench before the etching of the first dielectric layer, wherein the first and second dielectric layers have different materials. In some embodiments, the first dielectric layer includes silicon oxide and the second dielectric layer includes carbon and nitrogen. In some embodiments, the implanting of the ions includes using a tilted ion implantation process. In some embodiments, the tilted ion implantation process has a tilt angle in a range from about 15 degrees to 25 degrees with reference to normal of the substrate. In some embodiments, the depositing of the first dielectric layer includes an atomic layer deposition (ALD) process.

In yet another exemplary aspect, the present disclosure is directed to a semiconductor device. The semiconductor device includes a semiconductor substrate; first, second, and third semiconductor fins extending from the semiconductor substrate; a dielectric material layer disposed between the first and second semiconductor fins and between the second and third semiconductor fins, the dielectric material layer having a seam with an opening at a top surface of the dielectric material layer between the first and second semiconductor fins, the seam extending downwardly towards the semiconductor substrate; and a dielectric fin disposed above the dielectric material layer and between the second and third semiconductor fins. In some embodiments, spacing between the second and third semiconductor fins is greater than twice of spacing between the first and second semiconductor fins.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a semiconductor fin protruding from the semiconductor substrate, wherein the semiconductor fin has a first sidewall and a second sidewall opposing the first sidewall;
   an isolation layer disposed above the semiconductor substrate, wherein the isolation layer includes a first portion disposed on the first sidewall of the semiconductor fin and a second portion disposed on the second sidewall of the semiconductor fin, wherein top surfaces of the first and second portions of the isolation layer are leveled, and wherein the first portion of the isolation layer includes an air pocket; and
   a dielectric fin, wherein a bottom portion of the dielectric fin is embedded in the second portion of the isolation layer.

2. The semiconductor device of claim 1, wherein the second portion of the isolation layer is substantially free of air pockets.

3. The semiconductor device of claim 1, wherein the air pocket has an opening at the top surface of the first portion of the isolation layer.

4. The semiconductor device of claim 3, further comprising:
   a gate structure engaging the semiconductor fin, wherein the opening of the air pocket is capped by a high-k gate dielectric layer of the gate structure.

5. The semiconductor device of claim 1, wherein a bottommost portion of the air pocket is below a bottom surface of the dielectric fin.

6. The semiconductor device of claim 1, wherein a width of the dielectric fin is larger than a width of the semiconductor fin.

7. The semiconductor device of claim 1, further comprising:
   a liner interposing the semiconductor fin and the isolation layer.

8. The semiconductor device of claim 1, wherein the air pocket is a first air pocket and the dielectric fin includes a second air pocket.

9. The semiconductor device of claim 8, wherein the second air pocket has an opening at a top surface of the dielectric fin.

10. The semiconductor device of claim 8, wherein a height of the second air pocket is larger than a height of the first air pocket.

11. A semiconductor device, comprising:
    a semiconductor substrate;
    first, second, and third semiconductor fins extending from the semiconductor substrate;
    a dielectric material layer disposed between the first and second semiconductor fins and between the second and third semiconductor fins, the dielectric material layer having a seam with an opening at a top surface of the dielectric material layer between the first and second semiconductor fins, the seam extending downwardly towards the semiconductor substrate; and
    a dielectric fin disposed above the dielectric material layer and between the second and third semiconductor fins.

12. The semiconductor device of claim 11, wherein a top surface of the dielectric material layer between the first and second semiconductor fins and a top surface of the dielectric material layer between the second and third semiconductor fins are coplanar.

13. The semiconductor device of claim 11, wherein a bottom surface of the dielectric fin is below a top surface of the dielectric material layer.

14. The semiconductor device of claim 11, wherein a spacing between the second and third semiconductor fins is greater than a spacing between the first and second semiconductor fins.

15. The semiconductor device of claim 14, wherein the spacing between the second and third semiconductor fins is at least twice of the spacing between the first and second semiconductor fins.

16. The semiconductor device of claim 11, wherein the dielectric fin has another seam with an opening at a top surface of the dielectric fin and extending downwardly towards the semiconductor substrate.

17. The semiconductor device of claim 16, further comprising:
- a gate stack over the first, second, and third semiconductor fins and the dielectric fin, wherein the openings of the seams are both capped by the gate stack.

18. A semiconductor device, comprising:
- a semiconductor substrate;
- first and second semiconductor fins extending from the semiconductor substrate;
- an isolation feature disposed between the first and second semiconductor fins;
- a dielectric fin disposed between the first and second semiconductor fins, wherein a bottom portion of the dielectric fin is embedded in the isolation feature; and
- a gate stack over the dielectric fin and engaging the first and second semiconductor fins, wherein the gate stack seals a seam positioned in a top portion of the dielectric fin.

19. The semiconductor device of claim 18, wherein the seam has an aspect ratio less than about 8:1.

20. The semiconductor device of claim 18, wherein a bottommost portion of the seam is below a top surface of the isolation feature.

* * * * *